(12) United States Patent
Huang et al.

(10) Patent No.: US 7,989,697 B2
(45) Date of Patent: Aug. 2, 2011

(54) NETWORK COMMUNICATION DEVICE

(75) Inventors: Bin Huang, Shenzhen (CN); Chih-Yu Yeh, Taipei Hsien (TW); Shih-Chi Wong, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 210 days.

(21) Appl. No.: 12/423,818

(22) Filed: Apr. 15, 2009

(65) Prior Publication Data

US 2009/0283321 A1    Nov. 19, 2009

(30) Foreign Application Priority Data

May 16, 2008   (TW) ................................ 97208538 U

(51) Int. Cl.
*H02G 3/08* (2006.01)
(52) U.S. Cl. .............. 174/50; 174/58; 174/60; 174/563; 439/535; 361/600

(58) Field of Classification Search .................... 174/50, 174/57, 58, 60, 563; 439/535; 248/906; 361/600; 220/4.02
See application file for complete search history.

(56) References Cited

U.S. PATENT DOCUMENTS

| 6,121,548 A * | 9/2000 | Matsuoka ........................ 174/59 |
| 6,541,700 B2 * | 4/2003 | Chiriku et al. .................. 174/50 |

* cited by examiner

*Primary Examiner* — Dhiru R Patel
(74) *Attorney, Agent, or Firm* — Raymond J. Chew

(57) ABSTRACT

A network communication device includes a top component and a bottom cover forming a receiving space there between when assembled. The top component further includes a top cover and a body. The body is configured attaches the top cover and the bottom cover. The assembly of the top cover and the bottom cover utilizes at least one locking tab assembly. Each locking tab assembly includes a locking tab and a reciprocal locking structure engaged with the locking tab. One of the locking tabs and the reciprocal locking structure of the one locking tab assembly are utilized to assemble the top cover and the body is disposed on a first planar surface of the top cover, and another one of the locking tab and the reciprocal locking structure of the locking tab assembly is disposed on the body.

15 Claims, 19 Drawing Sheets

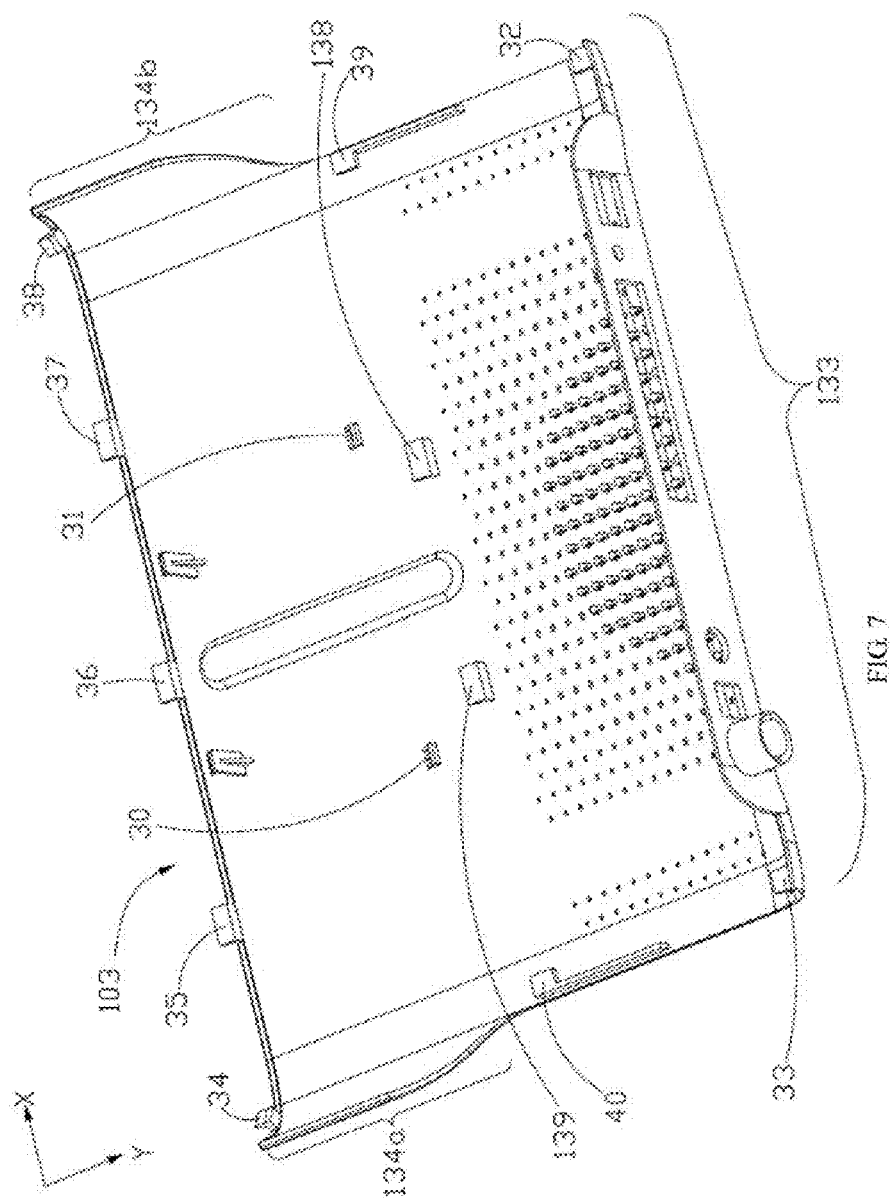

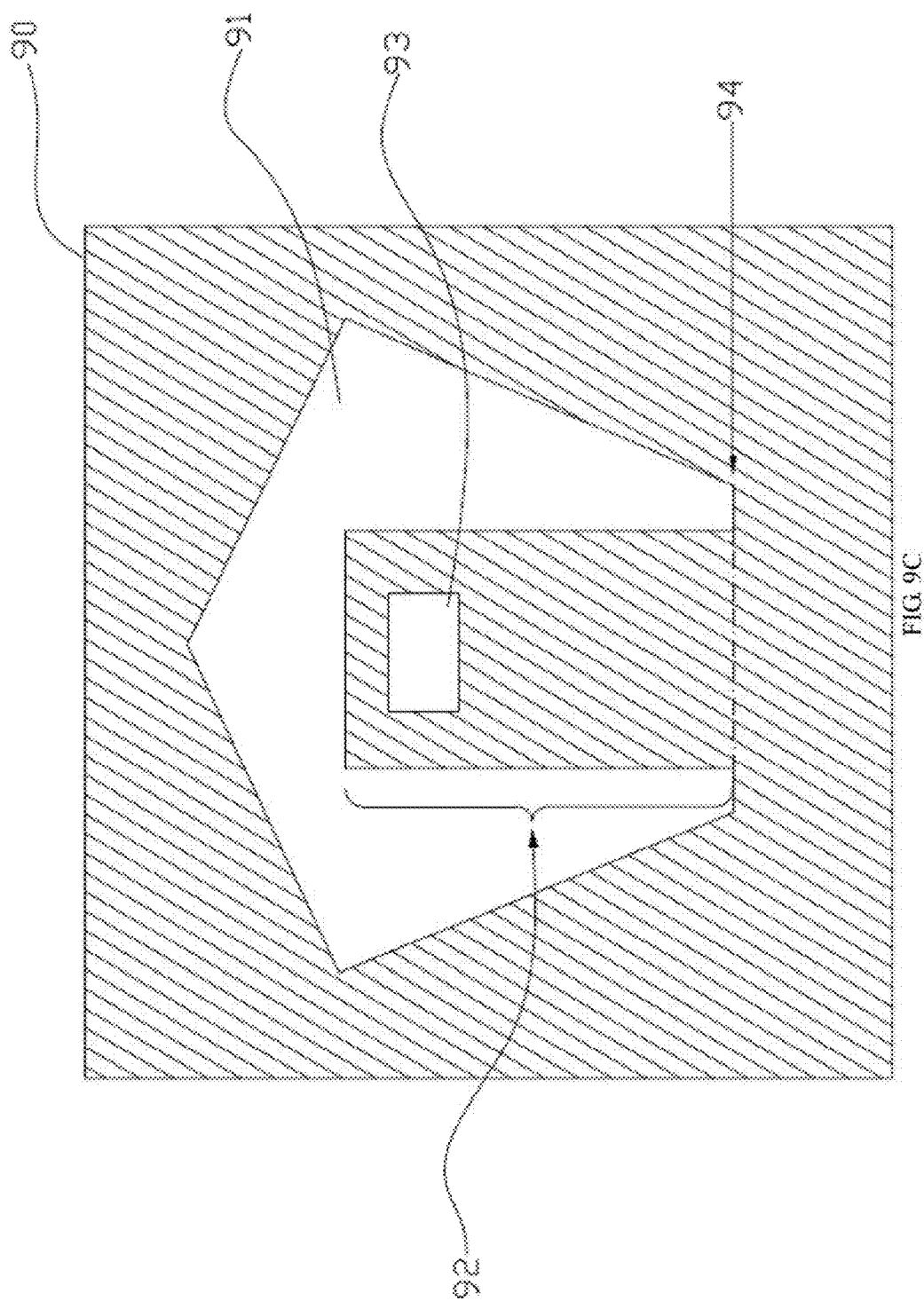

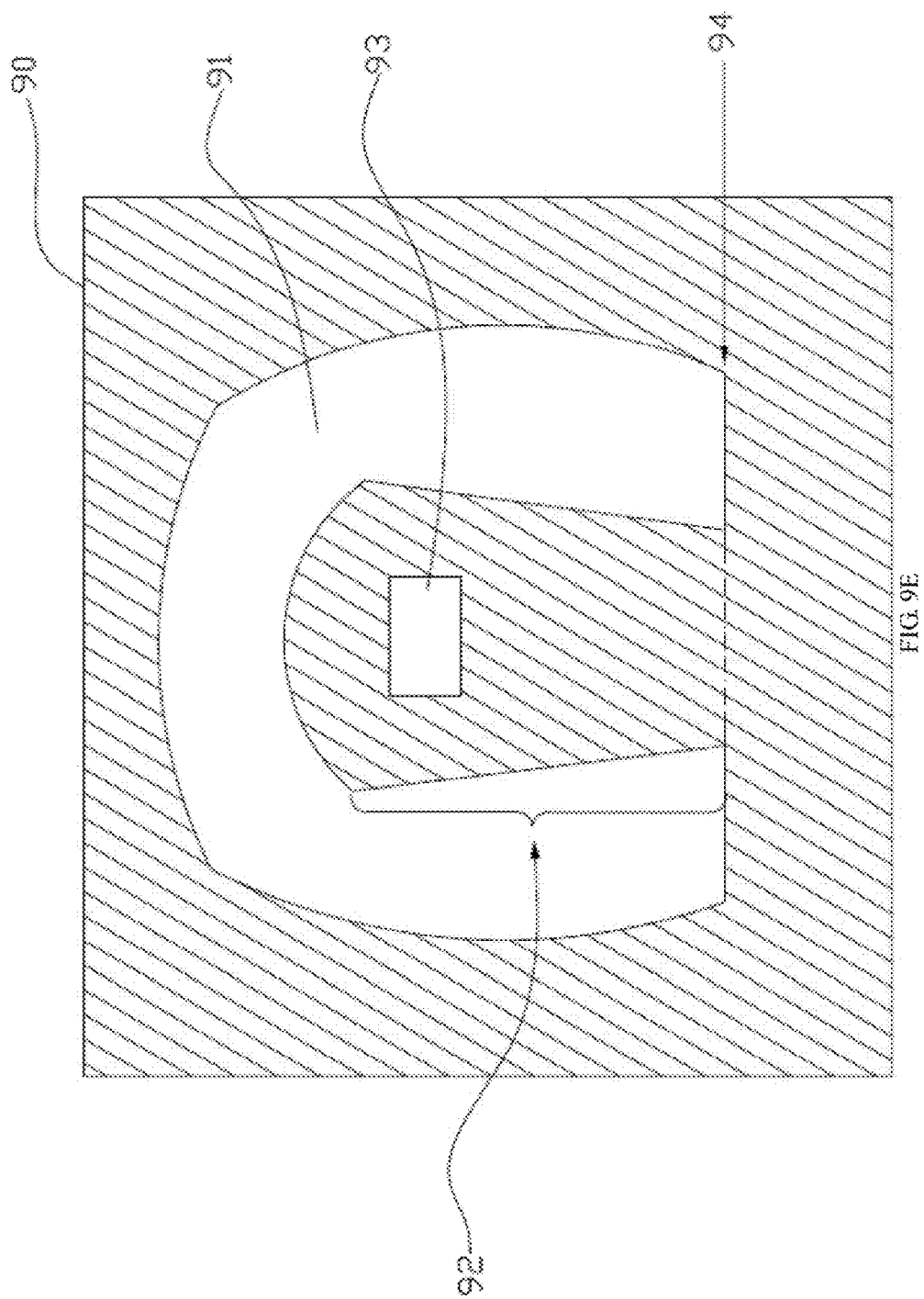

NETWORK COMMUNICATION DEVICE

BACKGROUND

1. Technical Field

The present disclosure relates to a network communication device, and more particularly to a network communication device with a three-piece case.

2. Description of Related Art

Current network communication devices typically utilize fasteners such as screws for assembling structural pieces, a choice requiring considerable material and manpower during manufacture and product assembly. For example, such an assembly may require two to four or more additional components such as fasteners, and demand more complex ornamental exterior appearance. The additional fasteners not only increase product cost but also greatly inhibit industrial design flexibility. Higher manufacturing costs are generated accordingly.

BRIEF DESCRIPTION OF THE DRAWINGS

FIG. 7 shows a lower surface of one embodiment of a top cover.

FIG. 9A-9E are structural diagrams of variations of a reciprocal locking structure of a planar surface.

DETAILED DESCRIPTION

Figure 1:
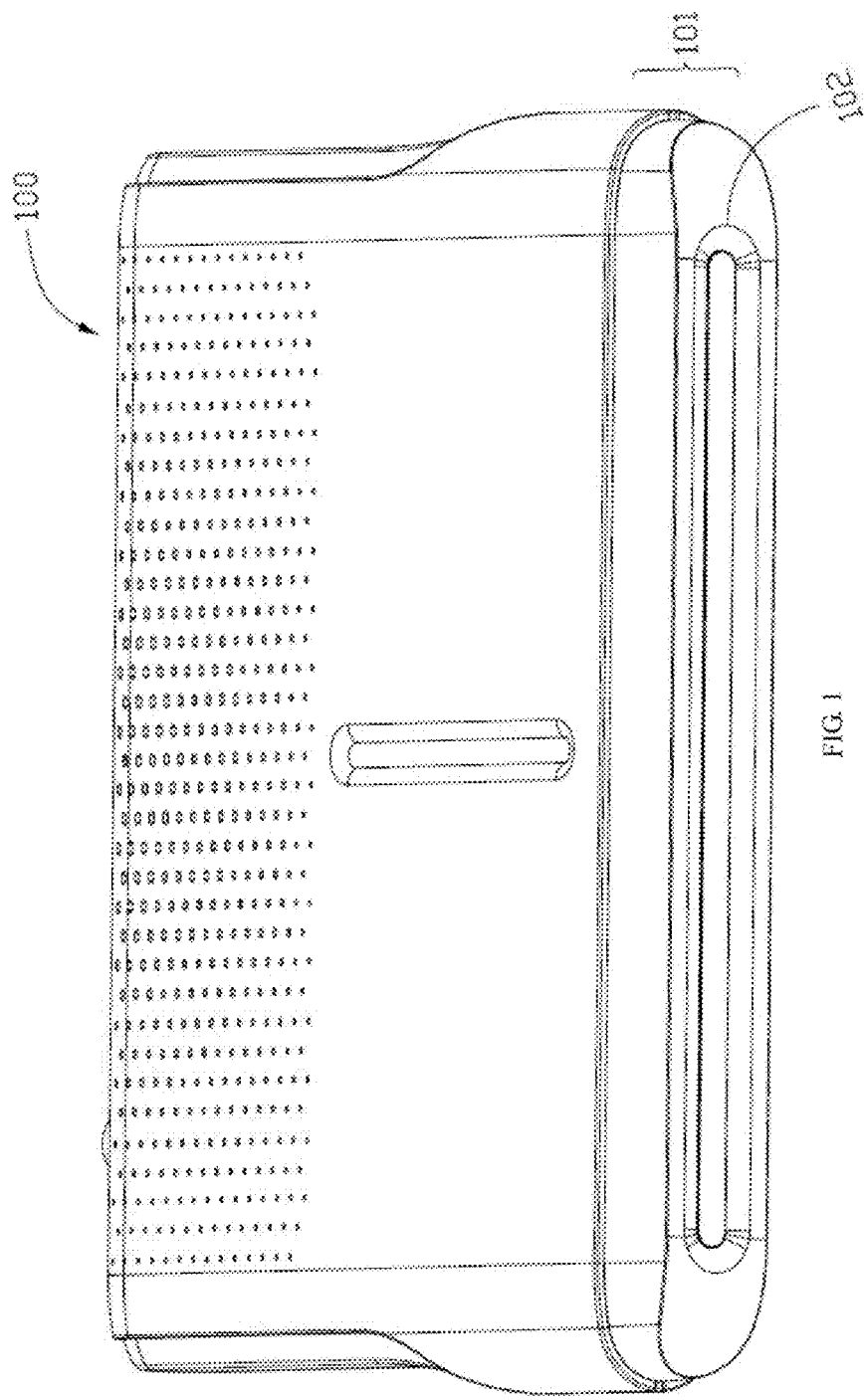
FIG. 1 is a front view of one embodiment of a network communication device.

FIG. 1 shows a network communication device 100. The network communication device 100 may embody an access device such as a digital subscriber line (DSL) modem, a cable modem, a set-top box, or other electronic device. The network communication device 100 comprises a front panel 101, which defines an area 102. The area 102 comprises a plurality of indicators to indicate power status, communication status and other operational information of the network communication device 100. The plurality of indicators may comprise light pipes with light emitting diodes (LED) or other light emitters. A case of the network communication device 100 may be plastic or any similar material.

Figure 2:
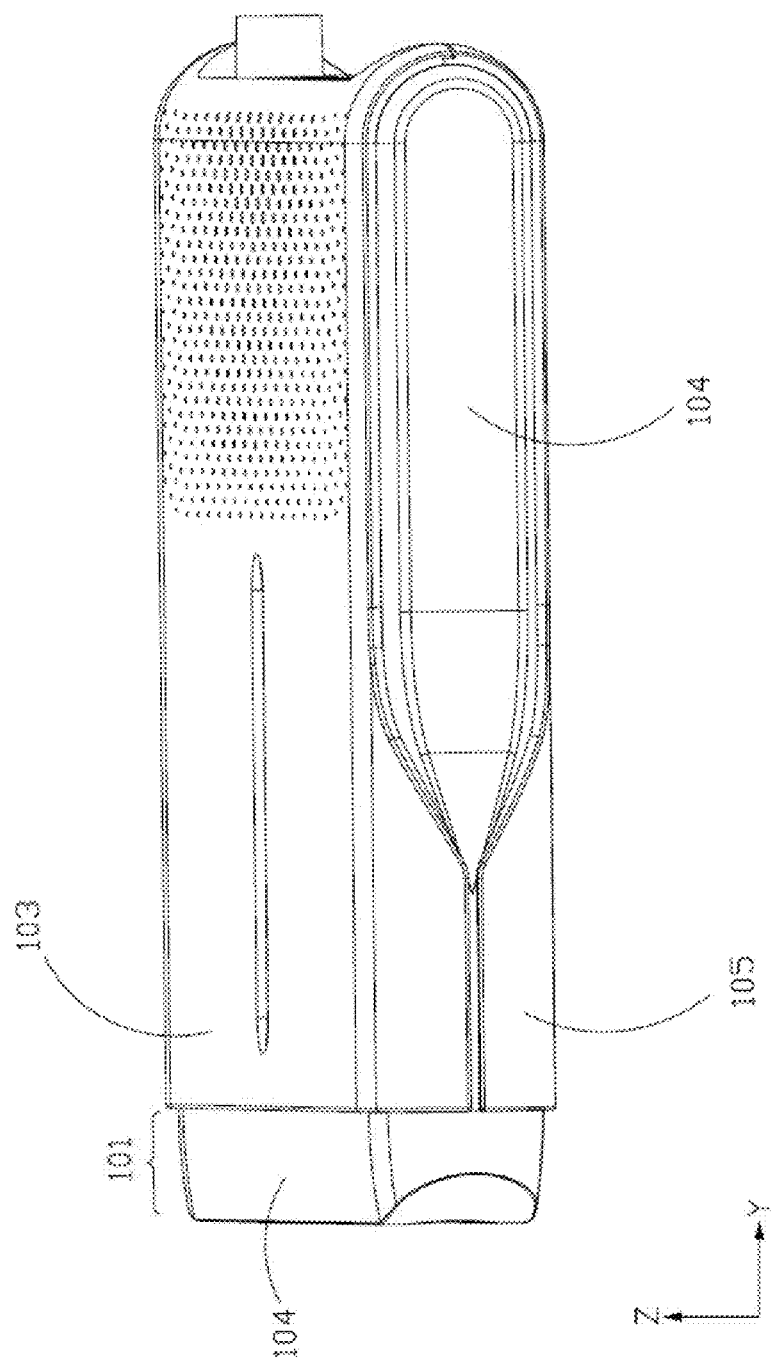
FIG. 2 is a side view of the network communication device.

FIG. 2 is a side view of the network communication device 100 of FIG. 1, which further comprises a top cover 103, a bottom cover 105 and a body 104 disposed between the top cover 103 and the bottom cover 105 when assembled.

Figure 3:
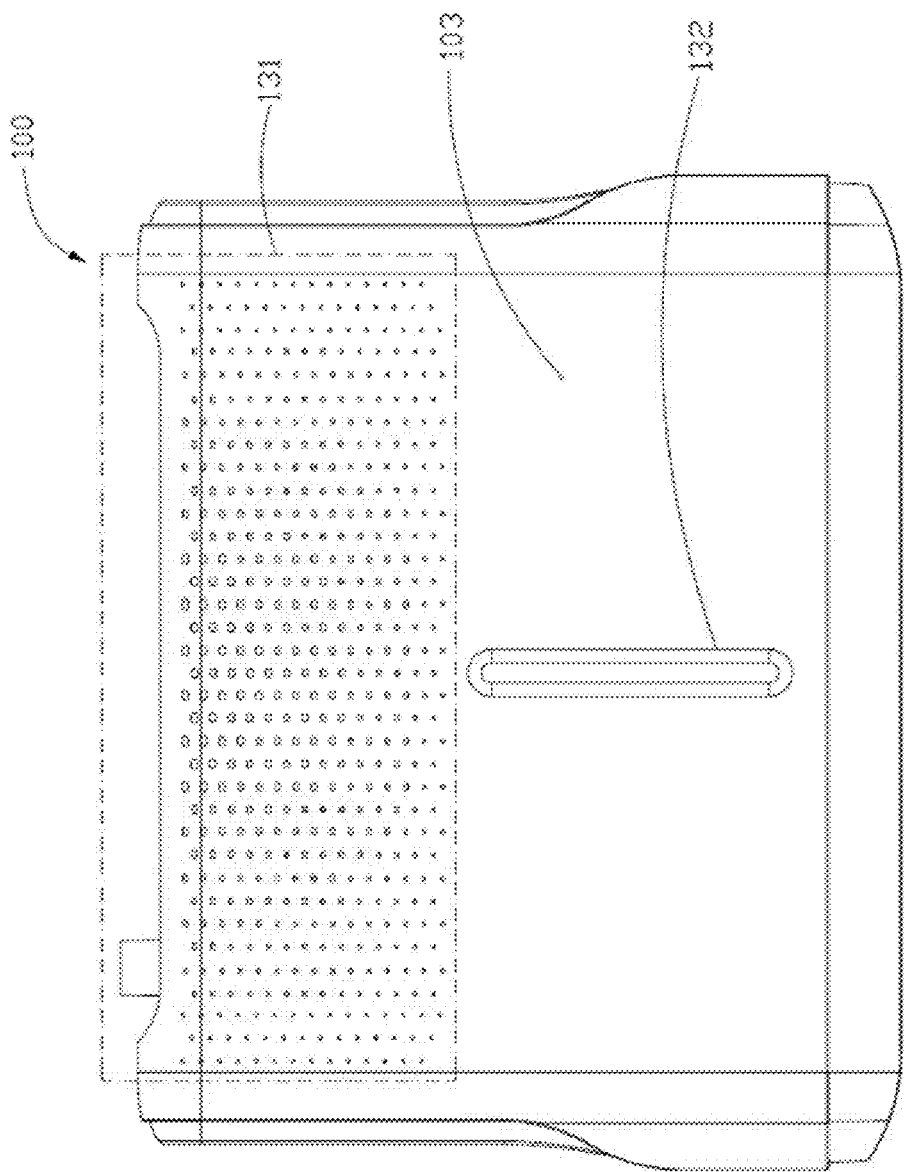
FIG. 3 is a top view of the network communication device.

FIG. 3 is a top view of the network communication device 100 of FIG. 1 defining a planar surface of the top cover 103. The top cover 103 defines a plurality of vent holes in an area 131. The planar surface of the top cover 103 may further comprise a recess 132 which may comprise attached decorative elements. It may be understood that the recess may be optional.

Figure 4:
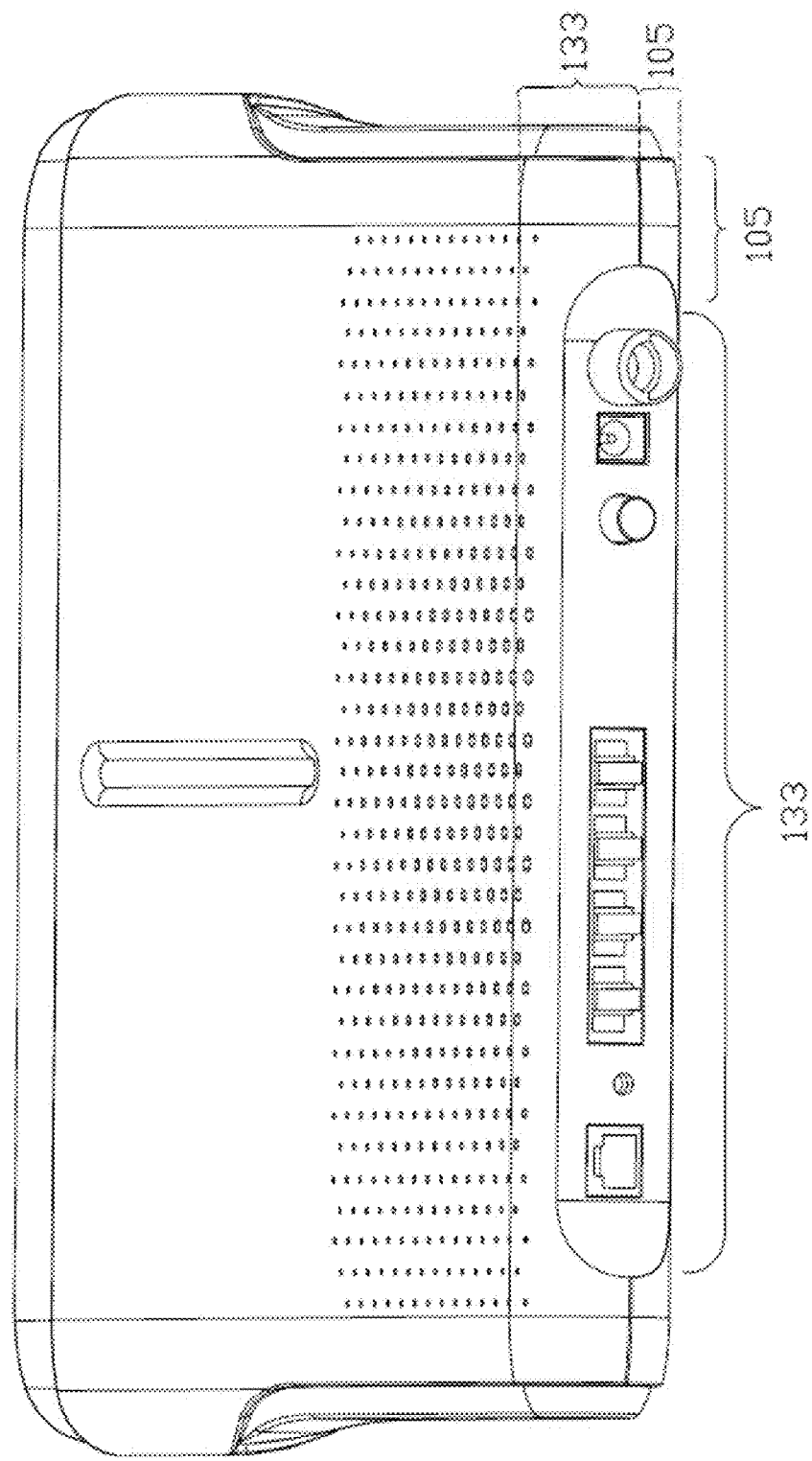
FIG. 4 is a rear view of the network communication device.

FIG. 4 is a rear view of the network communication device 100 of FIG. 1. The network communication device 100 comprises a rear panel 133 defining a plurality of openings configured for receiving switches and/or connection ports. The switches and/or connection ports may comprise an Ethernet jack, an RS-232 connector, a power connector, or a universal serial bus connector, for example.

Figure 5:
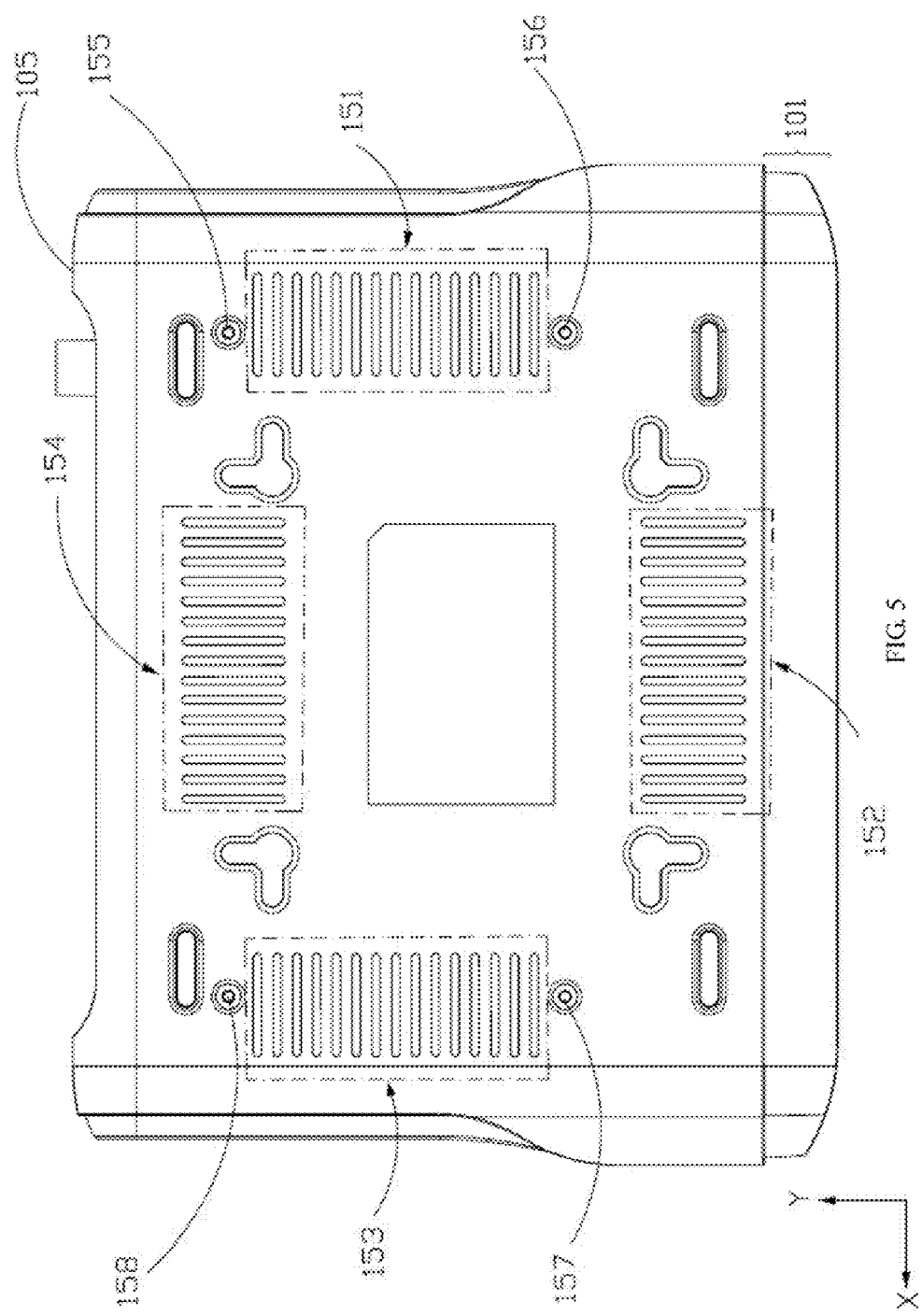
FIG. 5 is a bottom view of the network communication device.

FIG. 5 is a bottom view of the network communication device 100 of FIG. 1 defining a planar surface of the bottom cover 105. The bottom cover 105 defines a plurality of tapped holes 155-158 and a plurality of vent holes in areas 151-154. The bottom cover 105 and the body 104 may be fixed by fasteners through the plurality of tapped holes 155-158. Overall, the case of the network communication device 100 comprises the top cover 103, the body 104 and the bottom cover 105. A distance between the planar surface of the top cover 103 and the planar surface of the bottom cover 105 substantially determines the height of the network communication device 100.

Figure 6:
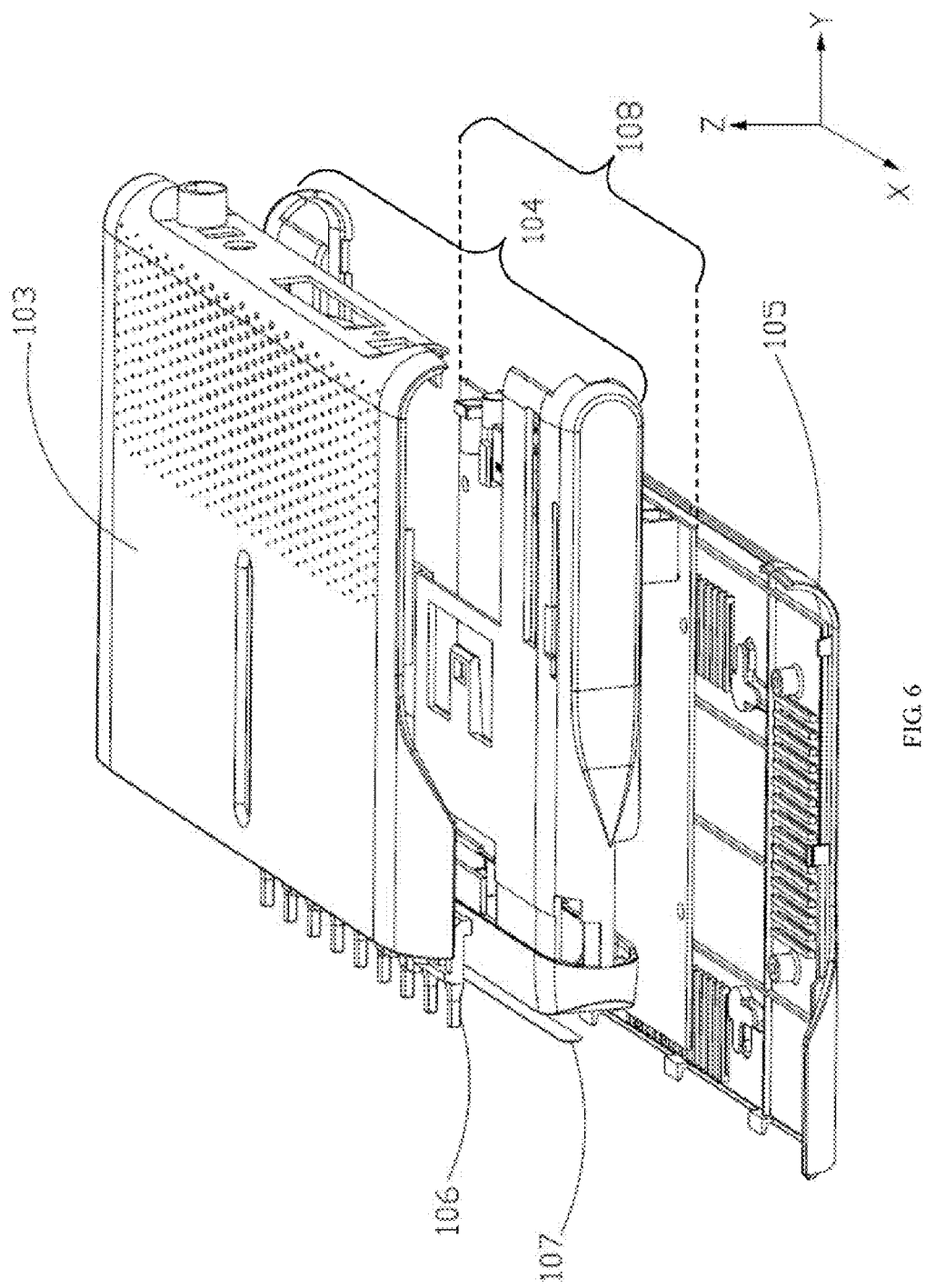
FIG. 6 is a schematic diagram of each member of the network communication device.

With reference to FIG. 6, the z-axis is referred to as an upward orientation. The network communication device 100 comprises the top cover 103, the body 104, the bottom cover 105, a light pipe 106, a surface mount 107 of the front panel 101 and a circuit board 108. The top cover 103 and the body 104 are assembled to form a top component of the case of the network communication device 100. The assembly of the top component and the bottom cover 105 collectively form a receiving space to receive components, such as the light pipe 106 and the circuit board 108. The surface mount 107 is attached onto the front panel 101. A surface of the surface mount 107 may be printed with graphs and/or characters, and comprises a transparent window with which the light pipe 106 is aligned and attached thereto. The light pipe 106 directs light out of the network communication device 100 from light-emitting devices on the circuit board 108 to be emitted through the window.

The network communication device 100 utilizes a plurality of locking tab assemblies to assemble the body 104 and the top cover 103 as an alternative to fastener-based assembly. Each locking tab assembly comprises a locking tab engaging a reciprocal locking structure. The reciprocal locking structure may be formed by a recess or an opening on the case members. A plurality of locking tabs and reciprocal locking structures may be disposed in corresponding positions on the top cover 103 and the body 104.

FIG. 7 shows a lower surface of the top cover 103. The top cover 103 comprises sidewalls 134a, 134b, and the rear panel 133, each extending from the planar surface to the bottom cover 105. The top cover 103 comprises locking tabs 30-40, where the locking tab 30 and the locking tab 31 are disposed on the lower surface of the main planar portion of the top cover 103. The locking tabs 32-40 are disposed along a periphery of the top cover 103. The locking tabs 32-40 are fastened on the body 104 when the periphery of the top cover 103 meets the body 104.

Figure 8A:
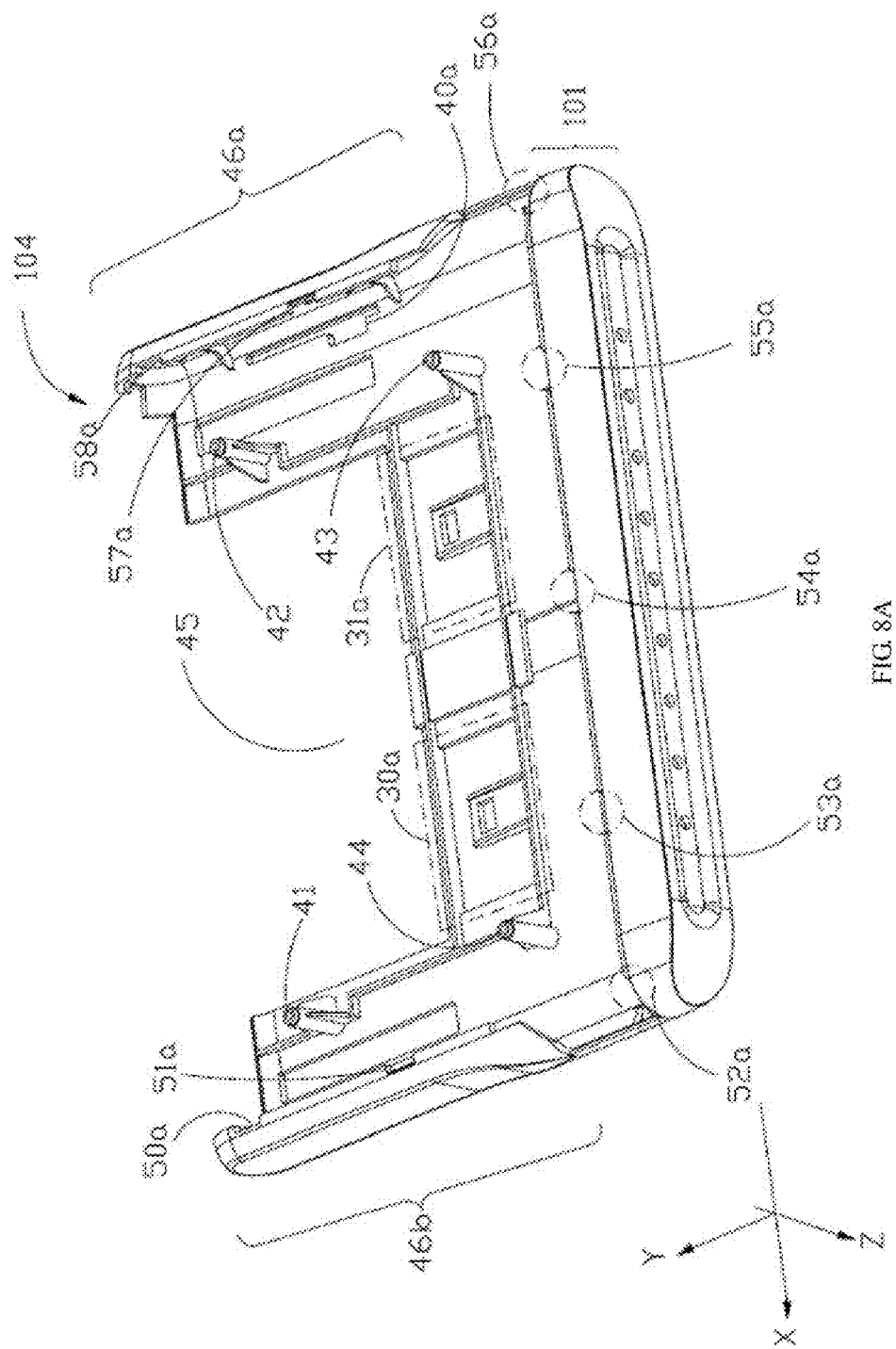
FIG. 8A shows a lower surface of a body of the network communication device.
Figure 8B:
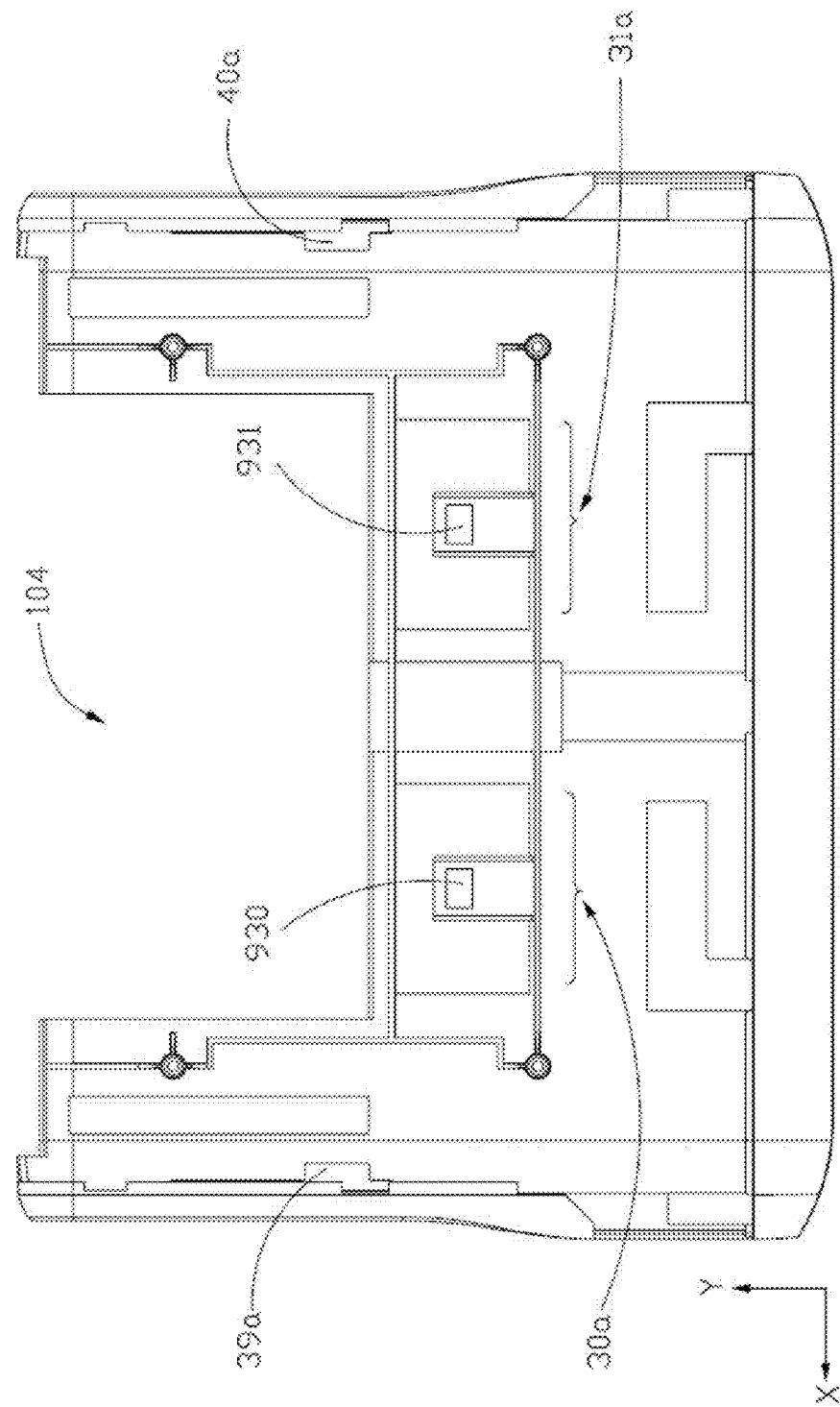
FIG. 8B is a schematic diagram of a body of the network communication device without the top cover deployed.
Figure 8C:
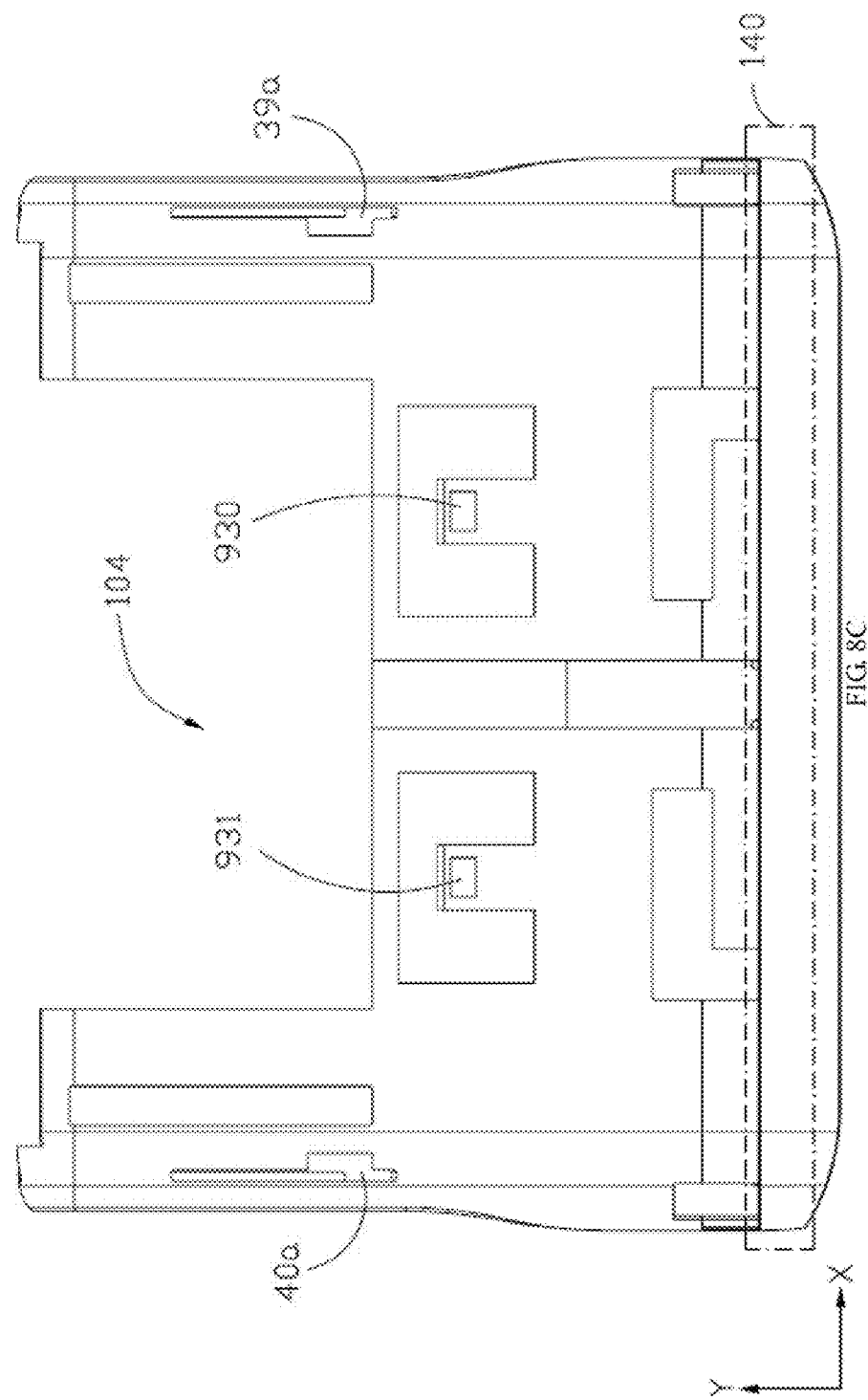
FIG. 8C shows an upper surface of the body of the network communication device.

FIGS. 8A and 8B show a lower surface of the body 104, on which reciprocal locking structures correspond to locking tabs 30-40, 138 and 139 are disposed. In an example, reciprocal locking structures 30a and 31a correspond to locking tabs 30 and 31. An opening 930 of the reciprocal locking structure 30a is configured to associate with the locking tab 30, and an opening 931 of the reciprocal locking structure 31a is configured to associate with the locking tab 31. The locking tabs 39 and 40 may be moved along the openings 39a and 40a and fasten on edges thereof. FIG. 8C shows an upper surface of the body 104, comprising reciprocal locking structures corresponding to the locking tabs 34-38 in an area 140. When the lower surface of the top cover 103 and the upper surface of the body 104 meet, the locking tabs and reciprocal locking structures on the top cover 103 and the body 104 are associated by relative sliding of the top cover 103 and the body 104.

Figure 10:
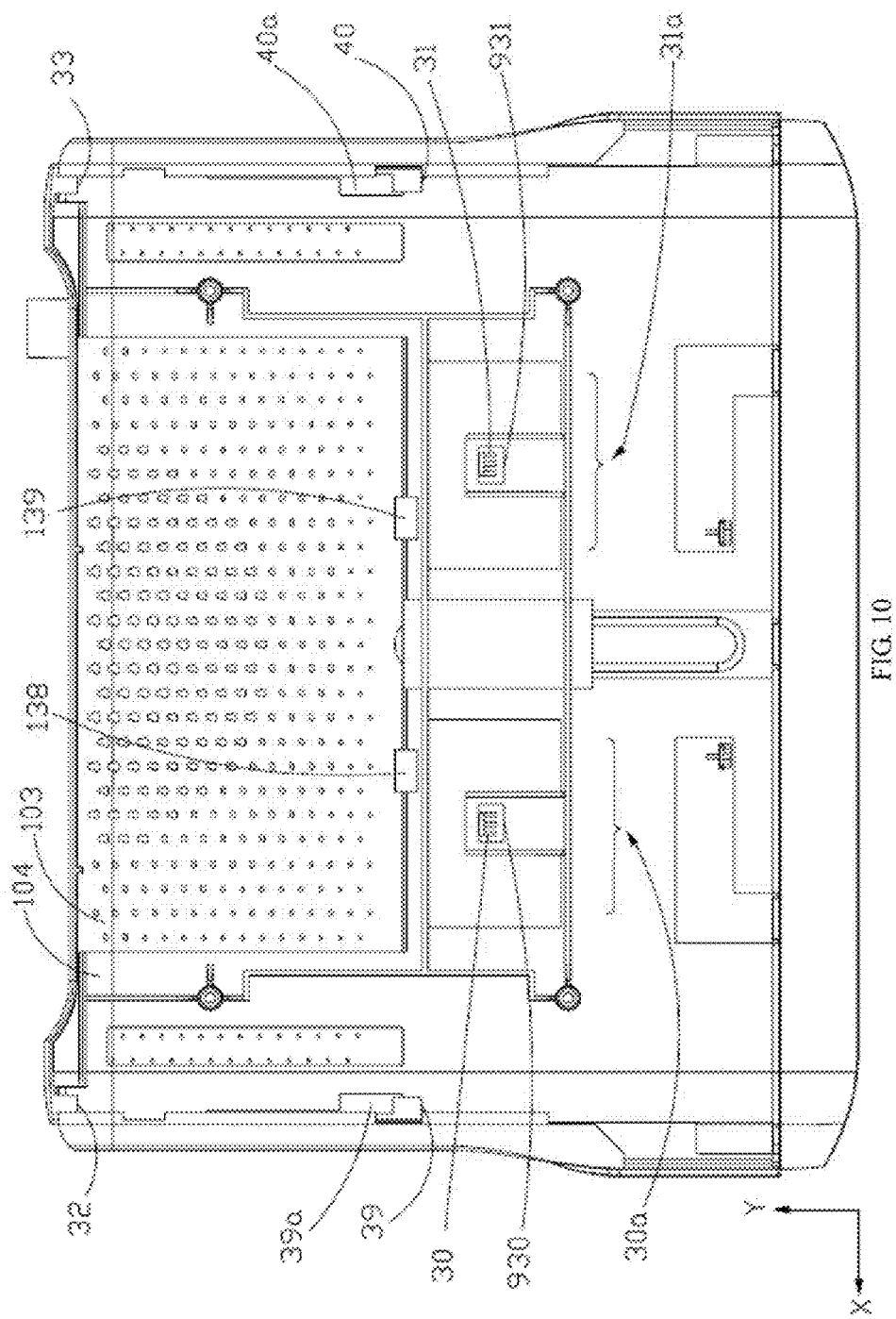
FIG. 10 is a schematic diagram of an assembly of the top cover and the body of the network communication device.

The reciprocal locking structure 30a and the locking tab 30 form one locking tab assembly, and the reciprocal locking structure 31a and the locking tab 31 another. The two locking tab assemblies restrain corresponding positions of the body 104 and the top cover 103 along a y-axis orientation with respect to the lower surface of the top cover 103. Specifically, with reference to FIG. 6, the upper surface of the body 104 contacts the lower surface of the top cover 103 in order to assemble the body 104 and the top cover 103. The reciprocal locking structures 30a and 31a are associated with locking tabs 30 and 31 respectively by moving the body 104 along the y-axis orientation, and the locking tabs 32-40 are also correspondingly associated with corresponding reciprocal locking structures. FIG. 8B shows the body 104 without the top cover 103. FIG. 10 shows the body 104 associated with the top cover 103.

With reference to FIG. 10, the locking tab 30 is associated with the opening 930 defined in an extended structure of the reciprocal locking structure 30a, and the locking tab 31 is associated with the opening 931 defined on an extended structure of the reciprocal locking structure 31a. The locking tab 39 is fixed on an edge of the opening 39a, and the locking tab 40 is fixed on an edge of the opening 40a. The locking tabs 138 and 139 are fixed on an edge of an opening 45.

The remaining locking tabs and reciprocal locking structures of the top cover 103 and the body 104 may be fixed to limit corresponding positions of the top cover 103 and the body 104 along x and y orientations. Locking tabs 34-38 and corresponding reciprocal locking structures restrain corresponding positions of the body 104 and the top cover 103 along the x, y and z-axis, and the locking tabs 32, 33, 40, 39 and corresponding reciprocal locking structures are utilized to restrain corresponding positions of the body 104 and the top cover 103 along the z-axis. X orientation is perpendicular to y orientation, and z orientation is perpendicular to the x-axis orientation and the y-axis direction.

Figure 9A:
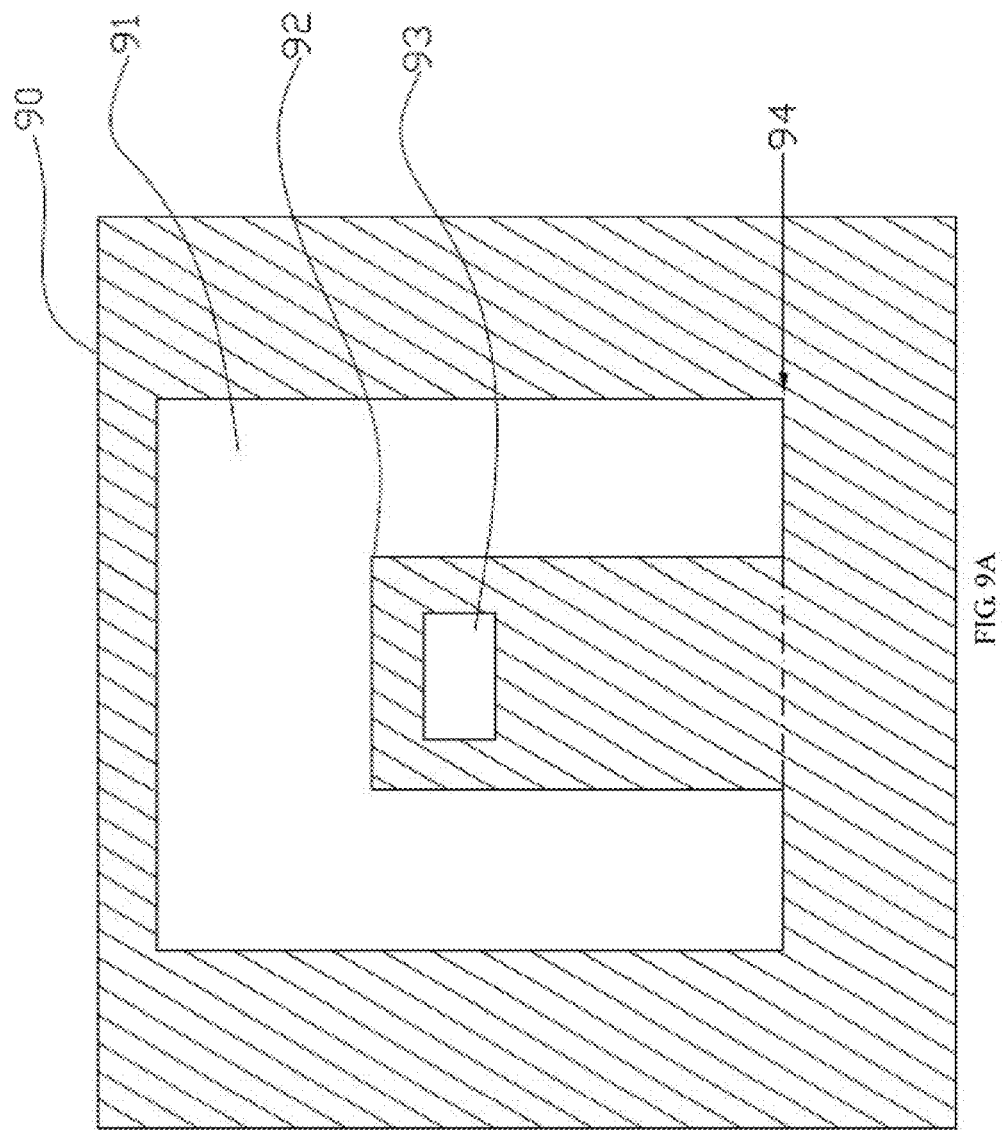
Figure 9B:
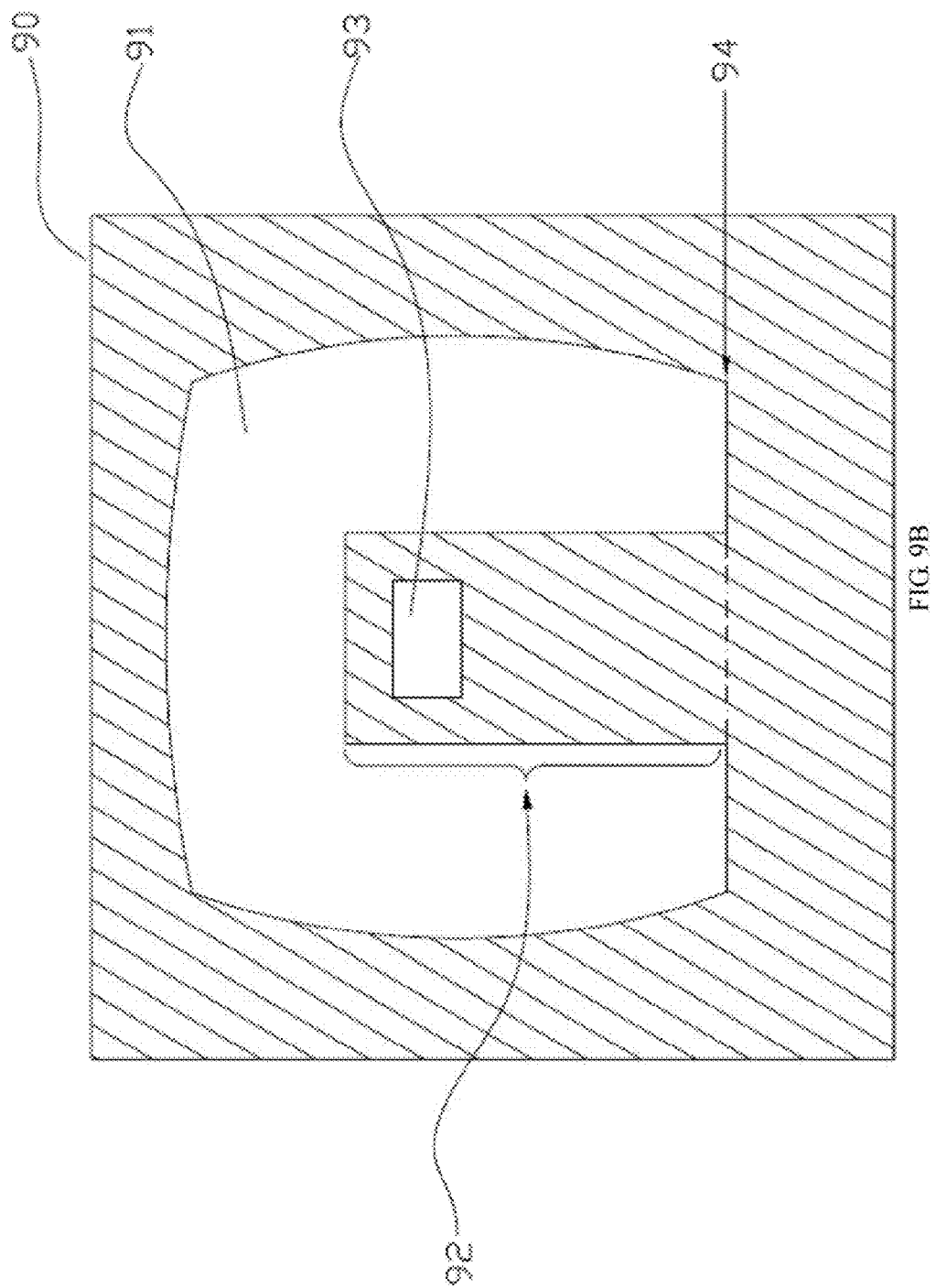
Figure 9D:
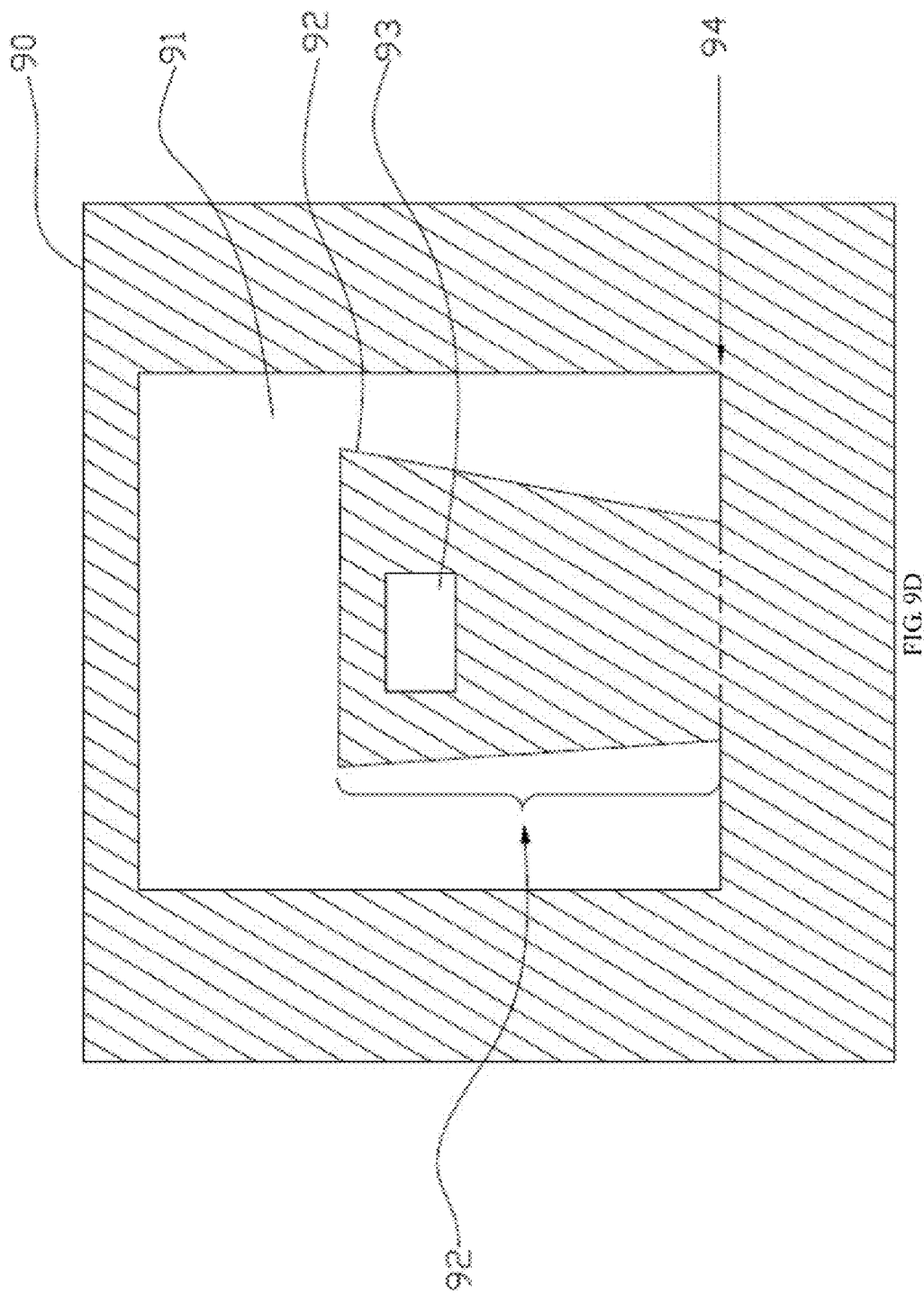

FIG. 9A-9E show variants of the reciprocal locking structure 30a and 31a. Reciprocal locking structures in FIG. 9A-9E comprise a planar surface 90, a hollow area 91, an extended area 92 and an opening 93. In FIG. 9A for example, the planar surface 90 on which the reciprocal locking structures 30a and 31a are disposed, comprises hollow area 91 and extended area 92. The extended area 92 extends from an edge 94 of the hollow area 91 inwards to the hollow area 91. The extended area 92 comprises the opening 93 for receiving locking tabs, such as receiving the locking tab 30 or 31. As shown in FIG. 9A-9E, the hollow area 91 and the opening 93 may take a variety of forms. The extended area 92 can be a variety of correspondingly different forms. While several different forms are shown for the reciprocal locking structures, other forms are equally applicable and remain well within the scope of the disclosure.

With reference to FIG. 8A, the body 104 comprises sidewalls 46a, 46b and the front panel 101 extended from a planar surface to the bottom cover 105. The body 104 further comprises tapped holes 41-44. Four fasteners are driven though the bottom cover 105, the circuit board 108 then associate with tapped holes 41-44 for associating the body 104, the circuit board 108 and the bottom cover 105. The opening 45 may align with vent holes defined in the area 131 of the top cover 103.

Figure 11:
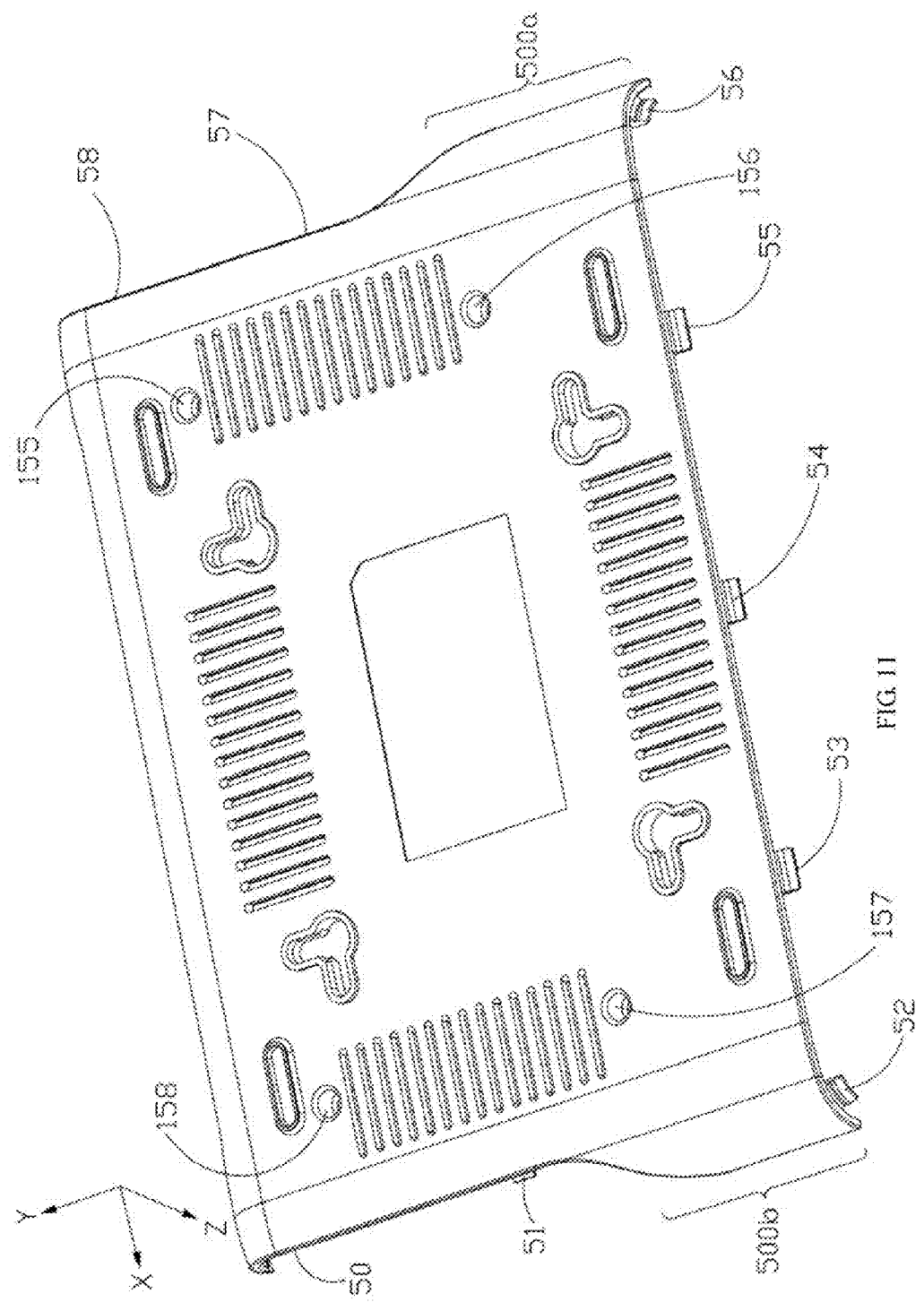
FIG. 11 is a schematic diagram of a bottom cover of the network communication device.

With reference to FIG. 11, the bottom cover 105 comprises sidewalls 500a and 500b extending from a planar surface to the top cover 103. The bottom cover 105 comprises locking tabs 50-58 and tapped holes 155-158. The body 104 comprises reciprocal locking structures corresponding to locking tabs 50-58. As an example, the front panel 101 can comprise reciprocal locking structures 52a-56a correspond to locking tabs 52-56. Reciprocal locking structures 50a, 51a, 57a and 58a disposed on sidewalls correspond to locking tabs 50, 51, 57 and 58. Four fasteners respectively pass through tapped holes 155-158 defined in the bottom cover 105 and the circuit board 108 to enter tapped holes 41-44, thereby fixing the body 104, the circuit board 108 and the bottom cover 105.

Figure 12:
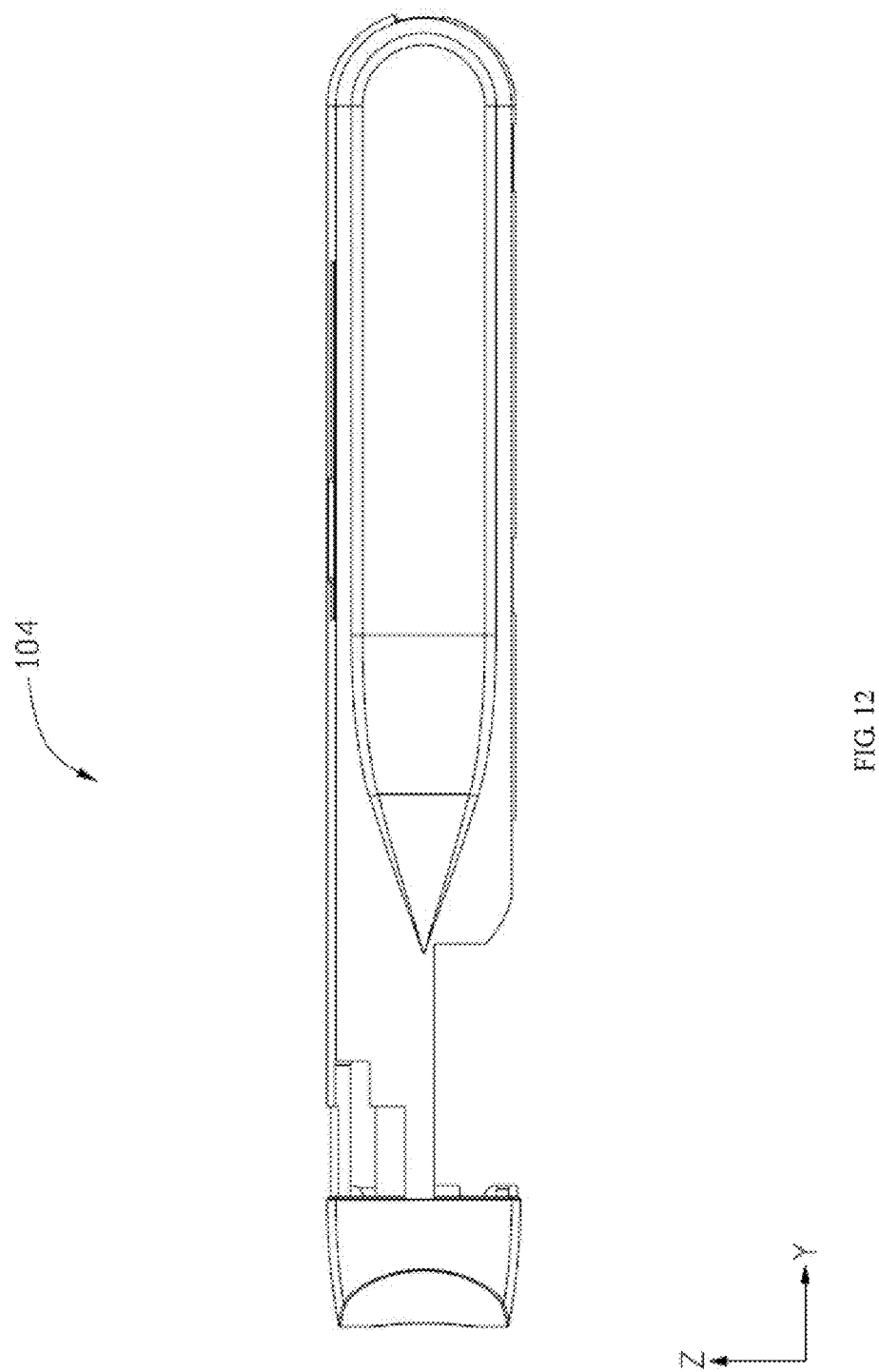
FIG. 12 shows a sidewall of the body of the network communication device.
Figure 13:
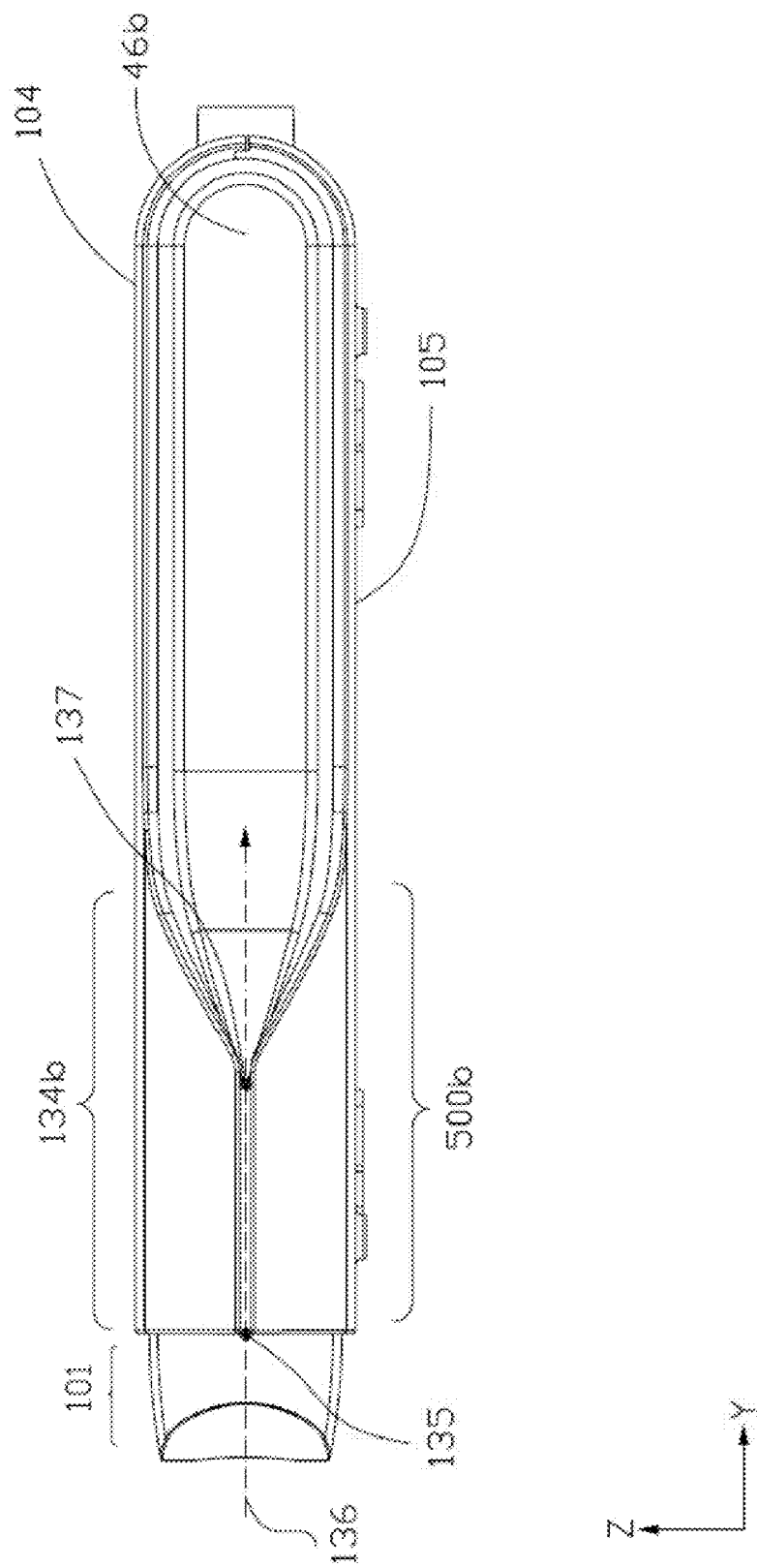
FIG. 13 shows a plurality of sidewalls of the network communication device.

The network communication device 100 with case members assembled is shown in FIGS. 1-5. Sidewalls of the network communication device 100 connect a top planar surface, a bottom planar surface, a front panel and a rear panel of the network communication device 100. While sidewalls on the two sides of the network communication device 100 are symmetric, the following description only illustrates only one side for brevity. FIG. 12 shows a sidewall of the body 104. As shown in FIG. 13, sidewalls of the network communication device 100 comprise sidewalls of the top cover 103, the body 104, and the bottom cover 105.

The sidewall 46b of the body 104 contacts the rear panel 133, the top cover 103 and the bottom cover 105. A sidewall 134b of the top cover 103 and a sidewall 500b contact an edge of the front panel 101. Edges of sidewalls 134b and 500b broadly contact at point 135 on an edge of the front panel 101, and the contacting edges extend from the point 135 to a point 137 on the sidewall 46b along a straight line 136 parallel to the y-axis. The edge of the sidewall 500b leaves the straight line 136 from the point 137 and extends to the lower surface of the bottom cover 105.

Due to simple mechanism, dismounting and assembly of the network communication device is easy. The assembly of the top cover and the body plastic pieces carries out a sliding and buckle action, utilizing a fixing method without requiring fasteners, thus decreasing product manufacture costs.

It is to be understood, however, that even though numerous characteristics and advantages of the disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A network communication device, comprising
a body, a top cover, and a bottom cover collectively forming a receiving space when assembled, wherein the body assembles the top cover and the bottom cover via a plurality of locking tabs and a plurality of reciprocal locking structures, each of the plurality of reciprocal locking structures comprises a hollow area, an extended area, and an opening, wherein each of the extended areas extending from an edge of each of the hollow areas inwards to the hollow areas and forming the openings of the reciprocal locking structures, one of the locking tabs engages one of the openings of the reciprocal locking structures for closing the top cover and the bottom cover, at least one of the locking tabs is disposed on a first planar surface of the top cover, and at least one of the reciprocal locking structures is disposed on a second planar surface of the body.

2. The network communication device as described in claim 1, wherein a height of the network communication device is substantially defined according to a distance between the first planar surface and the bottom cover.

3. The network communication device as described in claim 1, wherein at least two of the plurality of locking tabs are disposed along a periphery of the top cover, and at least two of the reciprocal locking structures are disposed along a periphery of the body.

4. The network communication device as described in claim 1, wherein the body comprises a front panel and a plurality of sidewalls extending from the second planar surface towards the bottom cover, the top cover comprises a rear panel and a plurality of sidewalls extending from the first planar surface to the bottom cover, and the front panel and the rear panel contact the bottom cover.

5. The network communication device as described in claim 4, wherein the plurality of sidewalls of the body and the plurality of sidewalls of the top cover collectively form sidewalls of the network communication device which connect the front panel, the rear panel, and the bottom cover.

6. The network communication device as described in claim 5, wherein the plurality of sidewalls of the body is assembled to the rear panel, and the plurality of sidewalls of the top cover is assembled to the front panel.

7. The network communication device as described in claim 6, wherein the bottom cover comprises a plurality of sidewalls contacting the front panel, the plurality of sidewalls of the top cover and the plurality of sidewalls of the body.

8. The network communication device as described in claim 4, wherein a sidewall of the bottom cover and a sidewall of the top cover are assembled from a first location on an edge of the front panel and along a line segment parallel to the first planar surface, and an edge of the sidewall of the top cover leaves from a second location on the line segment to approach the first planar surface, and the edge of the sidewall of the bottom cover leaves from the second location of the line segment to approach a planar surface of the bottom cover.

9. The network communication device as described in claim 4, further comprising display components disposed on the front panel, and connection ports disposed on the rear panel.

10. A network communication device, comprising:
a body, a top cover, and a bottom cover collectively forming a receiving space, wherein the top cover comprises a first planar surface and a rear panel extending from an edge of the first planar surface to the bottom cover, the body comprises a second planar surface and a front panel extending from an edge of the second planar surface to the bottom cover, the body and the top cover are assembled via a locking tab and a reciprocal locking structure, the reciprocal locking structure comprises a hollow area, an extended area, and an opening, wherein the extended area extends from an edge of the hollow area inwards to the hollow area and forming the opening of the reciprocal locking structure for receiving the locking tab,
the locking tab is disposed on the first planar surface of the top cover, and the reciprocal locking structure is disposed on the second planar surface of the body.

11. The network communication device as described in claim 10, wherein the locking tab and the reciprocal locking structure are configured for restricting corresponding positions of the body and the top cover in a front-rear direction of the network communication device.

12. The network communication device as described in claim 11, wherein the body comprises a plurality of sidewalls extending from the second planar surface towards the bottom cover, the top cover comprises a plurality of sidewalls extending from the first planar surface to the bottom cover, and the front panel and the rear panel contact the bottom cover.

13. The network communication device as described in claim 12, wherein the plurality of sidewalls of the body is configured for meeting the plurality of sidewalls of the top cover and forming sidewalls of the network communication device connecting the front panel, the rear panel and the bottom cover, the plurality of sidewalls of the body is configured for assembling the rear panel, and the plurality of sidewalls of the top cover is configured for assembling the front panel.

14. The network communication device as described in claim 11, further comprising display components disposed on the front panel, and the connection ports disposed on the rear panel.

15. The network communication device as described in claim 10, wherein the first planar surface constitutes a major portion of the top cover, the second planar surface constitutes a major portion of the body, and a height of the network communication device is substantially according to a distance between the first planar surface and the bottom cover.

* * * * *